United States Patent

Inoue et al.

[11] Patent Number: 5,825,262
[45] Date of Patent: Oct. 20, 1998

[54] LADDER FILTER WITH PIEZOELECTRIC RESONATORS EACH HAVING A PLURALITY OF LAYERS WITH INTERNAL ELECTRODES

[75] Inventors: Jiro Inoue; Toshihiko Unami, both of Omihachiman; Tetsuo Takeshima, Toyama, all of Japan

[73] Assignee: Murata Manufacturing Co., Ltd., Kyoto-fu, Japan

[21] Appl. No.: 846,296

[22] Filed: Apr. 30, 1997

[30] Foreign Application Priority Data

Nov. 22, 1996 [JP] Japan .................................. 8-327708

[51] Int. Cl.$^6$ .............................. H03H 9/15; H03H 9/58; H03H 9/10
[52] U.S. Cl. .......................... 333/189; 310/328; 310/348; 310/359; 310/366
[58] Field of Search ..................................... 333/186–192; 310/311, 321, 328, 348, 357, 359, 366

[56] References Cited

U.S. PATENT DOCUMENTS

4,503,352  3/1985  Inoue .................................. 333/187 X
4,759,107  7/1988  Ogawa et al. ....................... 310/365 X
5,381,067  1/1995  Greenstein et al. ................ 310/359 X Primary Examiner—Robert J. Pascal
Assistant Examiner—Barbara Summons
Attorney, Agent, or Firm—Graham & James LLP

[57] ABSTRACT

A ladder type filter achieves a substantial reduction in distortion in filtering characteristics. The ladder type filter includes a supporting substrate formed of an insulating material. Supporting members are attached to lands which are formed by portions of pattern electrodes disposed on the supporting substrate. A plurality of piezoelectric resonators are mounted on the supporting members and connected in a ladder arrangement to define a ladder type filter. Each piezoelectric resonator has a base member in which piezoelectric layers and internal electrodes are laminated. External electrodes formed on one side surface of the base member are connected to the internal electrodes disposed in the base member. The width w and the thickness t of the piezoelectric resonators and the number n of laminated layers each comprising one of the piezoelectric layers and one of the internal electrodes disposed adjacent to the corresponding piezoelectric layer are selected so as to satisfy $1 \leq \log_{10}(n^2 wt) \leq 3$.

20 Claims, 11 Drawing Sheets

SAMPLE 3

FIG.12

SAMPLE 4

LADDER FILTER WITH PIEZOELECTRIC RESONATORS EACH HAVING A PLURALITY OF LAYERS WITH INTERNAL ELECTRODES

BACKGROUND OF THE INVENTION

1. Field of the Invention

The present invention relates generally to ladder type filters and, more particularly, to a ladder type filter in which a plurality of piezoelectric resonators are connected in a ladder arrangement.

2. Description of the Related Art

Figure 16:
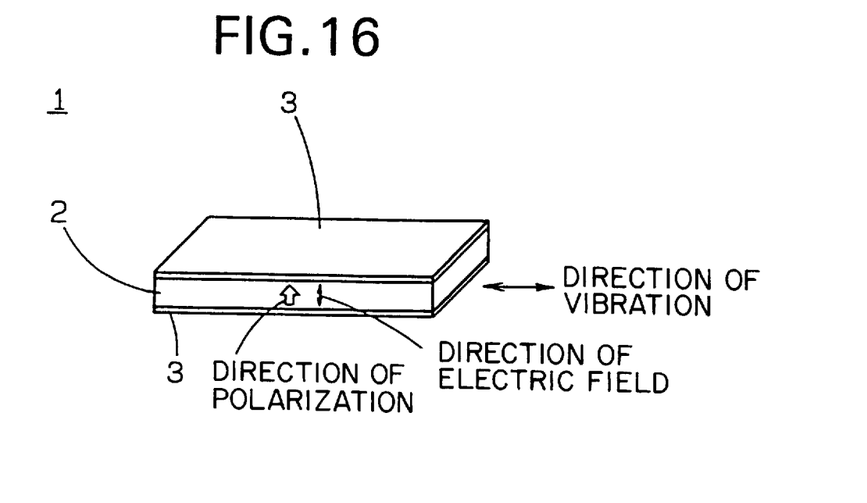
FIG. 16 is a perspective view of a piezoelectric resonator used in conventional ladder type filters.

FIG. 16 is a perspective view of a piezoelectric resonator 1 for use in a conventional ladder type filter. The piezoelectric resonator 1 includes a single piezoelectric substrate 2 in the form of, for example, a flat block having rectangular major surfaces. The single piezoelectric substrate 2 is polarized along the direction of the thickness thereof. Electrodes 3 are provided on the two major surfaces of the piezoelectric substrate 2. When a signal is input between the electrodes 3, an electric field is applied to the single piezoelectric substrate 2 along the direction of the thickness of the single piezoelectric substrate 2. As a result, the single piezoelectric substrate 2 vibrates in the longitudinal direction.

Figure 17:
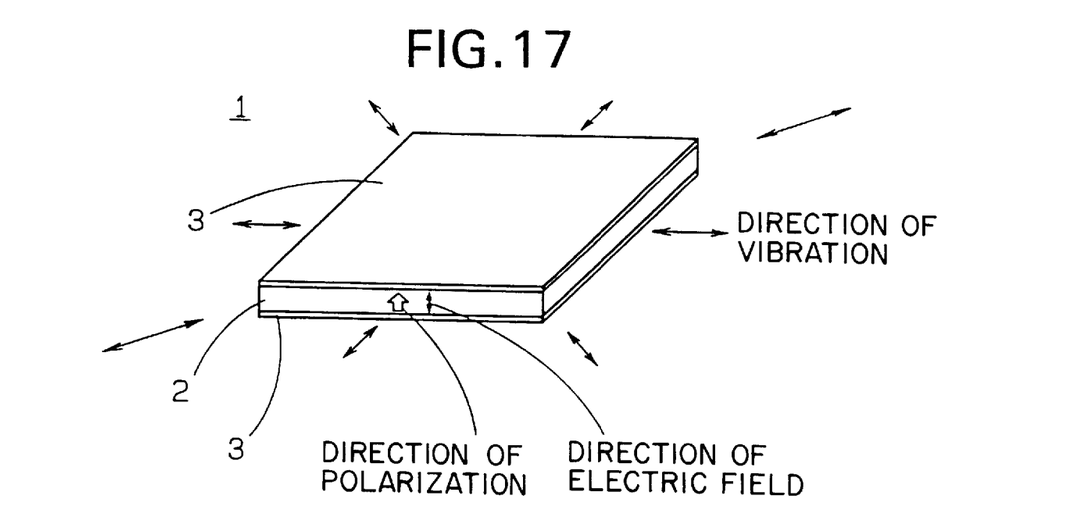
FIG. 17 is a perspective view of another piezoelectric resonator used in conventional ladder type filters.

FIG. 17 shows a piezoelectric resonator 1 including a single piezoelectric substrate 2 in the form of a flat block having square major surfaces, and electrodes 3 disposed on the major surfaces of the single piezoelectric substrate 2. Also in this piezoelectric resonator 1, the single piezoelectric substrate 2 is polarized along the direction of thickness thereof. When a signal is input between the electrodes 3 in the piezoelectric resonator 1, an electric field is applied to the piezoelectric substrate 2 along the direction of the thickness and the piezoelectric substrate 2 vibrates in a square-type vibration mode (in a plane direction).

Figure 18:
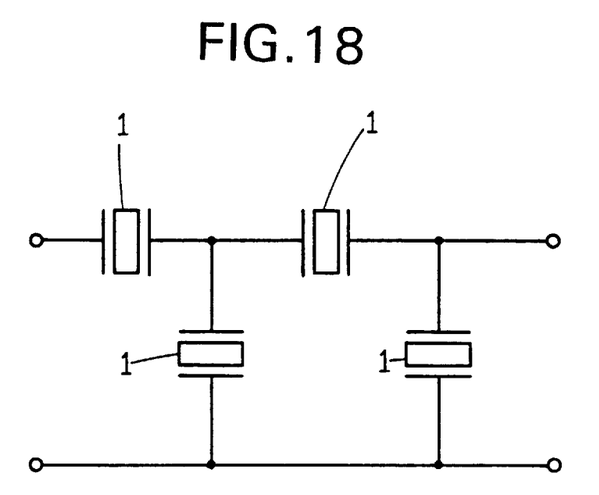
FIG. 18 is an equivalent circuit diagram of a conventional ladder type filter using the piezoelectric resonator shown in FIG. 16 or 17.

A ladder type filter can be formed by connecting piezoelectric resonators of this type in series and in parallel in a ladder arrangement, as shown in FIG. 18. For example, such a ladder type filter is used as an intermediate frequency filter in a radio, a communication apparatus or the like.

In operation of such a ladder type filter, however, a disturbance of the filtered waveform often occurs. For example, this disturbance often appears as a considerable reduction in 2 Db band width.

SUMMARY OF THE INVENTION

To overcome the problems with prior art resonators described above, the preferred embodiments of the present invention provide a ladder type filter which substantially reduces distortion in filtering characteristics.

According to one preferred embodiment of the present invention, a ladder type filter comprises a plurality of piezoelectric resonators connected in series and in parallel in a ladder arrangement, each of the piezoelectric resonators including a base member having a plurality of piezoelectric layers and a plurality of electrodes alternately laminated along a longitudinal direction of the base member, the piezoelectric resonator vibrating in the longitudinal direction of the base member in response to an application of an electric field between each adjacent pair of the electrodes, wherein if a width of the piezoelectric resonators is w; a thickness of the piezoelectric resonators is t; and the number of laminated layers each comprising one of the piezoelectric layers and one of the electrodes which is located adjacent to the corresponding piezoelectric layer is n, then an inequality:

$$1 \leq \log_{10}(n^2 wt) \leq 3$$

is preferably satisfied.

In this ladder type filter, each of the piezoelectric layers is preferably polarized along the longitudinal direction of the base member.

Also, the adjacent pair of the piezoelectric layers located on the opposite sides of each of the electrodes are preferably polarized in opposite directions.

Further, each adjacent pair of the electrodes may be respectively connected to two different external terminals, which may be disposed on one side surface of the base member.

In this ladder type filter, a plurality of the above-described piezoelectric resonators may be connected in series and in parallel in a ladder arrangement on an insulating substrate having pattern electrodes provided on a surface thereof, and a cap may be placed on the insulating substrate so as to cover the piezoelectric resonators.

The inventors of the present invention proposed, for example, in the specification of Japanese Patent Application 8-110475, which corresponds to co-pending U.S. patent application Ser. No. 08/829,597 for "PIEZOELECTRIC RESONATOR AND ELECTRONIC COMPONENT CONTAINING SAME" (Attorney docket No. 36856.22), which applications are hereby incorporated by reference, a laminated piezoelectric resonator which can be substituted for piezoelectric resonators used in conventional ladder type filters. This piezoelectric resonator is a stiffened piezoelectric resonator in which the direction of application of an electric field and the direction of vibration are the same. As a result of this unique structure, this stiffened type piezoelectric resonator has a larger number of factors, such as the width, the thickness and the number of laminated layers, which contribute to filtering characteristics, in comparison with the conventional piezoelectric resonators. Based upon this discovery, the inventors studied whether an improvement in filtering characteristics can be achieved by controlling such factors in a ladder type filter using such a laminated, stiffened type piezoelectric resonator. The inventors discovered that excellent filtering characteristics are obtained if the width of the piezoelectric resonator, represented by w, the thickness of the piezoelectric resonator, represented by t, the number of laminated layers each preferably comprising one piezoelectric layer and one electrode adjacent to the corresponding piezoelectric layer, represented by n, satisfy an inequality: $1 \leq \log_{10}(n^2 wt) \leq 3$.

In a piezoelectric resonator used in such a ladder type filter, piezoelectric layers are preferably polarized along the longitudinal direction of a base member and an electric field is applied to the piezoelectric layer disposed between each adjacent pair of the electrodes. External electrodes to be connected to the internal electrodes disposed in the base member may be provided on one surface of the piezoelectric resonator to enable the piezoelectric resonator to be mounted on a substrate in a surface mount manner to form the ladder type filter.

Also, a chip type ladder filter can be constructed in such a manner that pattern electrodes are provided on an insulating substrate, piezoelectric resonators are mounted on the substrate so as to form a ladder type filter circuit, and the piezoelectric resonators are thereafter covered with a cap.

According to the preferred embodiments of the present invention, a ladder type filter having improved filtering characteristics is obtained. This ladder type filter is arranged to have a substantially larger 2 dB band width than prior art ladder filters.

Because piezoelectric resonators of the preferred embodiments of the present invention are adapted to be mounted on a substrate in a surface mount manner, there is no need to use lead wires or the like for connection of the piezoelectric resonators, thereby enabling the ladder type filter to have a substantially reduced size. Further, if the ladder type filter is designed as a chip component, the unique structure allows the chip component ladder type filter to be mounted easily on a printed circuit board or the like.

The above-described and other objects, features and advantages of the present invention will become apparent from the detailed description of preferred embodiments of the invention with reference to the accompanying drawings.

DETAILED DESCRIPTION OF PREFERRED EMBODIMENTS

Figure 1:
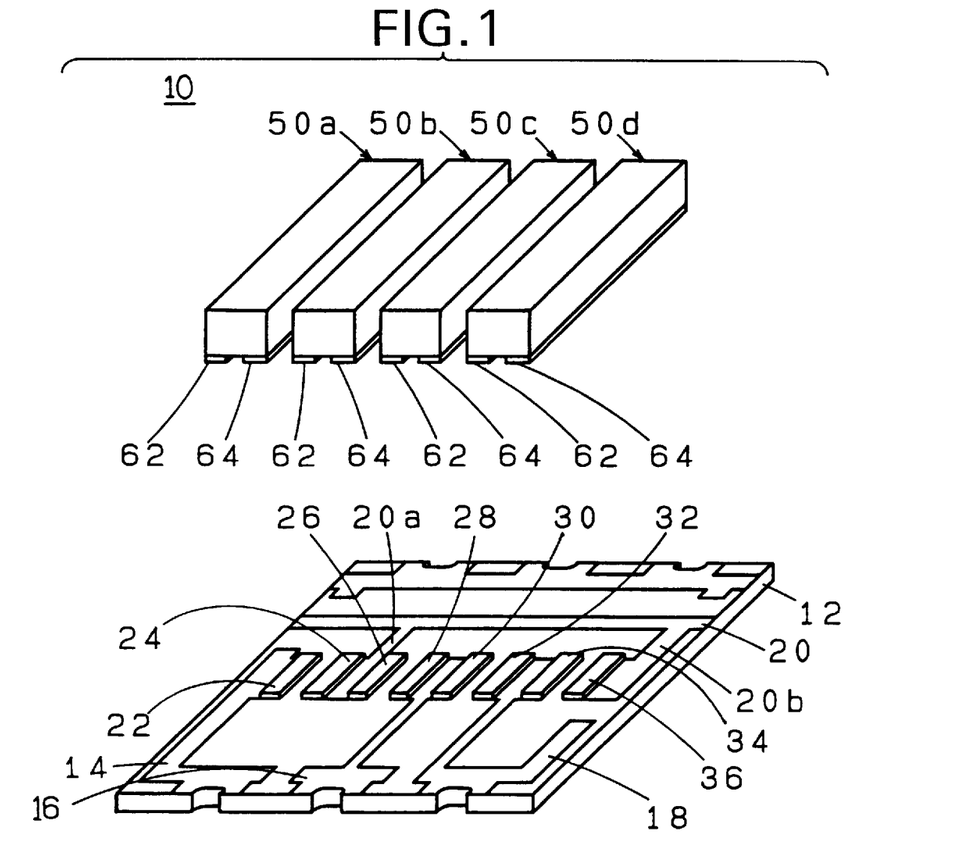
FIG. 1 is an exploded perspective view of a ladder type filter which represents a preferred embodiment of the present invention.
Figure 2:
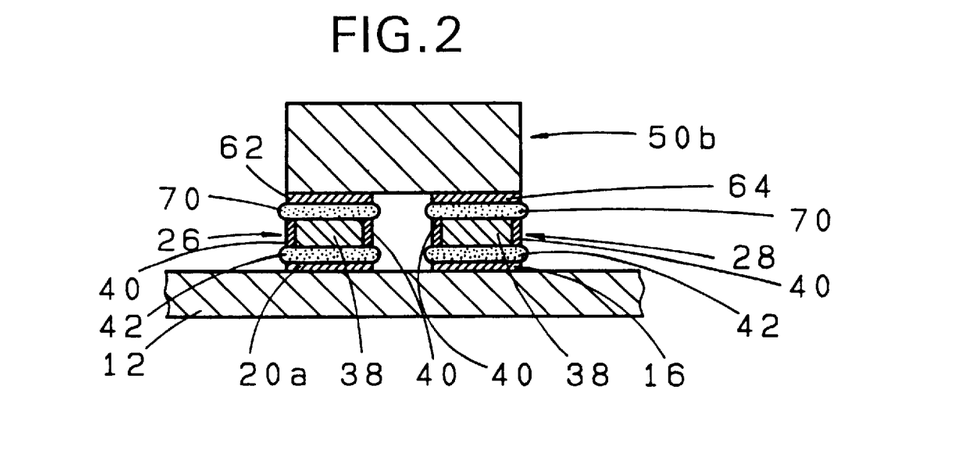
FIG. 2 is a cross-sectional view of a portion of the ladder type filter shown in FIG. 1.

FIGS. 1 and 2 show a ladder type filter 10 which represents a preferred embodiment of the present invention. The ladder type filter 10 includes a supporting substrate 12 preferably formed of an insulating material such as alumina or other suitable material. Three recesses seen in FIG. 1 are preferably formed in each of two opposite side portions of the supporting substrate 12. Four pattern electrodes 14, 16, 18, and 20 are preferably provided on the supporting substrate 12. The pattern electrodes 14, 16, and 18 are arranged so as to extend from the three recesses in one of the side portions of the supporting substrate 12 toward a central portion of the supporting substrate 12.

The pattern electrode 20 is arranged so as to extend between the opposite side portions of the supporting substrate 12 where no recess is formed. Two extensions 20a and 20b extend from the pattern electrode 20 toward the central portion of the supporting substrate 12. The extension 20a is formed so as to extend toward a position between the two pattern electrodes 14 and 16 while the other extension 20b is formed so as to extend toward the pattern electrode 18 along one of the opposite sides of the supporting substrate 12 where no recesses are formed. Extended end portions of the pattern electrodes 14, 16, and 18 and the extensions 20a and 20b of the pattern electrode 20 are increased in width to form lands, which are preferably arranged in a row as seen in FIG. 1.

A supporting member 22 is attached to the land of the pattern electrode 14. Two supporting members 24 and 26 are attached to the land of the extension 20a of the pattern electrode 20; two supporting members 28 and 30 are attached to the land of the pattern electrode 16; and two supporting members 32 and 34 are attached to the land of the pattern electrode 18. A supporting member 36 is attached to the land of the extension 20b of the pattern electrode 20. For example, each of these supporting members 22 to 36 is arranged in such a manner that surface electrodes 40 are disposed on opposite side surfaces of a core 38 which is preferably formed of an epoxy resin or the like. The supporting members 22 to 36 are connected to the lands by an electroconductive adhesive 42 or the like. When this connection is made, major surfaces of the supporting members 22 to 36 on which no surface electrode 40 is disposed are bonded to the lands by the electroconductive adhesive 42. The electroconductive adhesive 42 contacts the surfaces of the surface electrodes 40 on the opposite surfaces of the supporting members 22 to 36 to electrically connect the lands and the surface electrodes 40.

Figure 3:
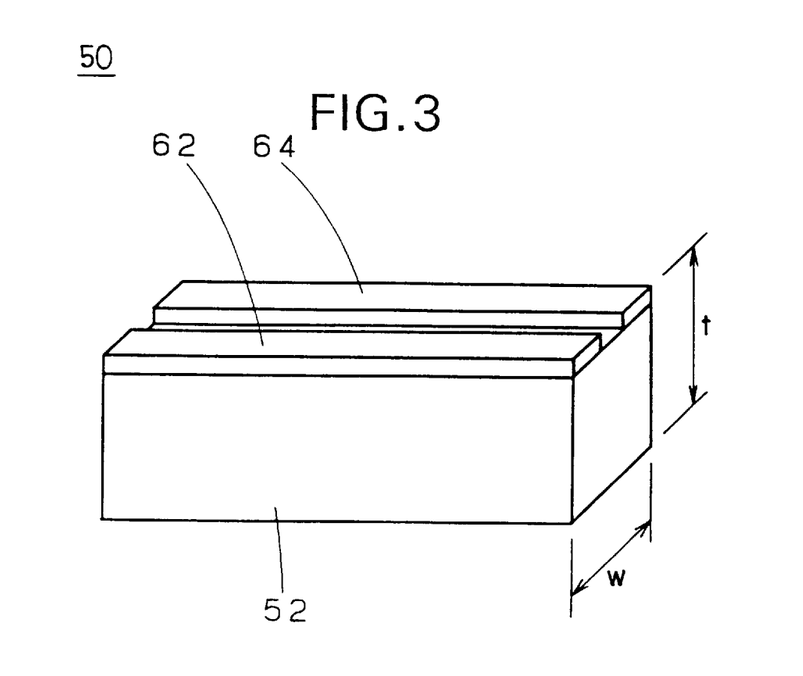
FIG. 3 is a perspective view of a piezoelectric resonator used in the ladder type filter shown in FIG. 1.
Figure 4:
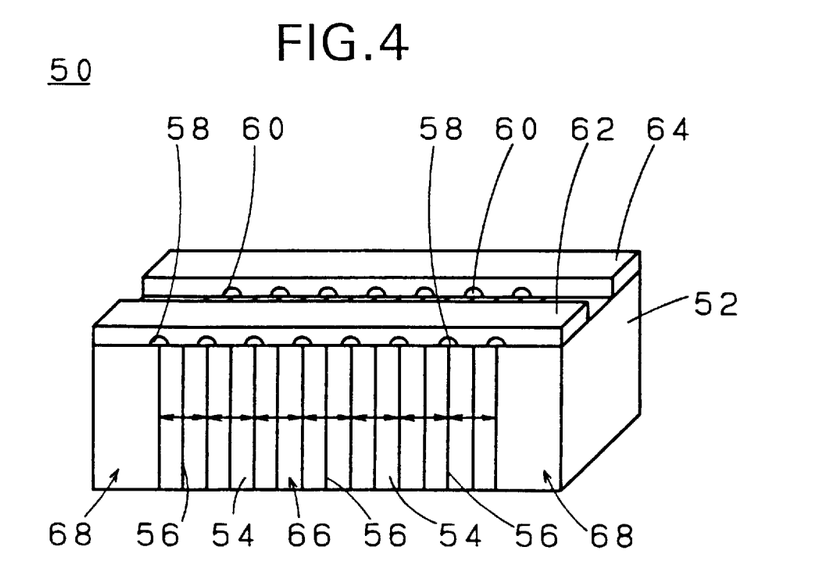
FIG. 4 is a diagram showing the structure of the piezoelectric resonator shown in FIG. 3.

Piezoelectric resonators 50 are mounted on the supporting members 22 to 36. As shown in FIG. 3, each piezoelectric resonator 50 preferably includes a base member 52 having, for example, the shape of a substantially rectangular block. As shown in FIG. 4, the base member 52 is preferably formed by laminating a plurality of piezoelectric layers 54 formed of, for example, a piezoelectric ceramic material, and a plurality of electrodes 56. Each electrode 56 is arranged so that its major surfaces are substantially perpendicular to the longitudinal direction of the base member 52. The piezoelectric layers 54 are preferably polarized along the longitudinal direction of the base member 52 so that the adjacent pair of piezoelectric layers 54 on the opposite sides of each internal electrode 56 are polarized in opposite directions, as indicated by the arrows in FIG. 4. However, the base member 52 is preferably not polarized at the opposite ends in the longitudinal direction so as to form an inactive section.

Figure 5:
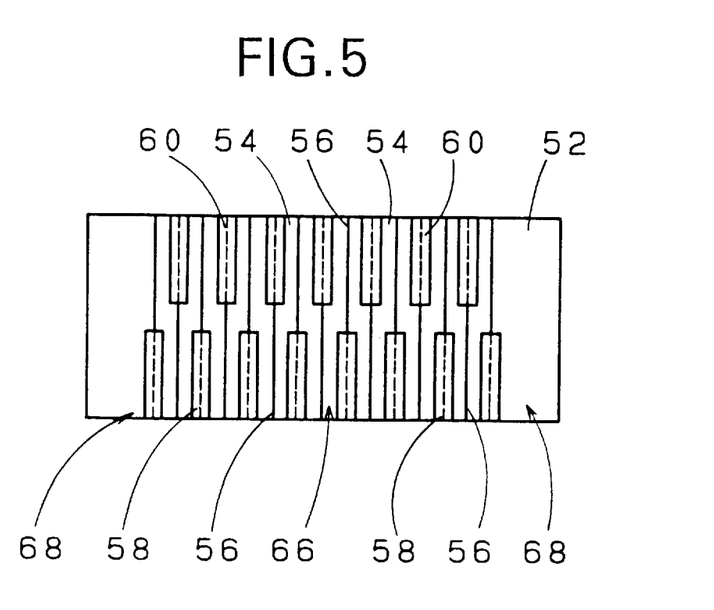
FIG. 5 is a plan view of a base member which is used in the piezoelectric resonator shown in FIG. 4, and on which strips of insulating film are provided.

As shown in FIG. 5, on one side surface of the base member 52, strips of insulating film 58 and 60 are disposed adjacent to two longer sides of the side surface and are arranged opposed to each other in the widthwise direction of the base member 52. Edges of the electrodes 56 are exposed in the side surface of the base member 52. Portions of the exposed edges of the electrodes 56 adjacent to one longer side of the side surface are alternately covered and left uncovered by insulating film 58. In other portions of the exposed edges of the electrodes 56 adjacent to the other longer side of the side surface, those opposite from the exposed edge portions not covered with insulating film 58 are covered by insulating film 60.

Figure 6:
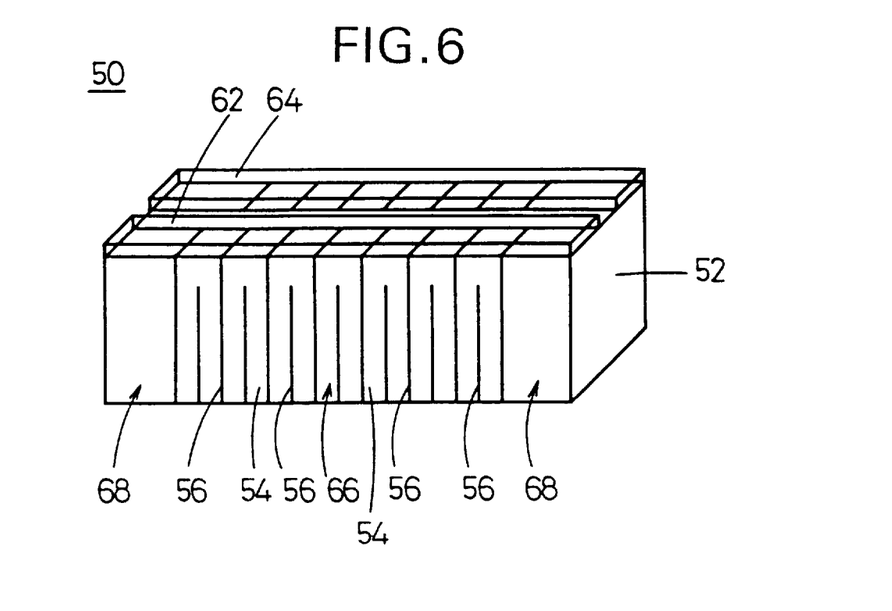
FIG. 6 is a diagram of another example of the piezoelectric resonator used in the ladder filter shown in FIG. 1.
Figure 7:
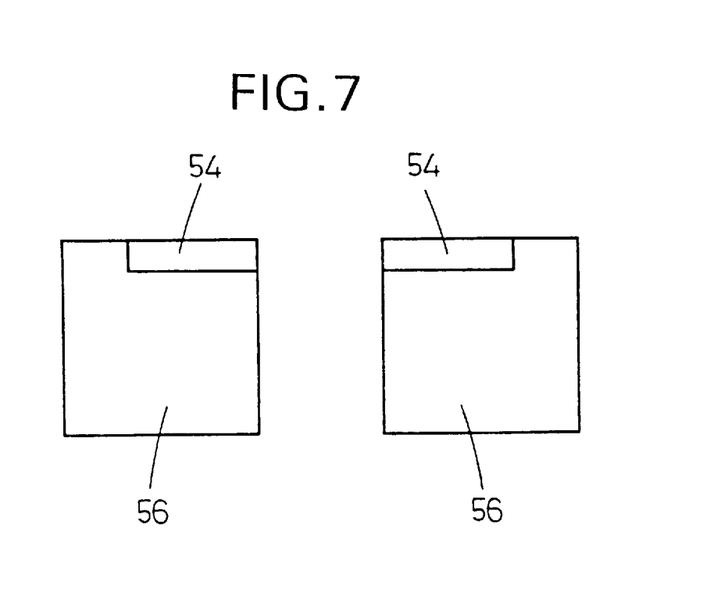
FIG. 7 is a diagram showing two cross sections of a base member used in the piezoelectric resonator shown in FIG. 6.

Further, external electrodes 62 and 64 are provided on the side surface of the base member 52 and arranged opposite to each other in the widthwise direction, i.e., on two portions of the side surface of the base member 52 on which insulating films 58 and 60 are disposed. The electrodes 56 not covered with insulating film 58 are connected to the external electrode 62 while the electrodes 56 not covered with insulating film 60 are connected to the external electrode 64. That is, in each adjacent pair of the electrodes 56, one electrode 56 is connected to one of the external electrodes 62 or 64 while the other is connected to an alternate one of the external electrodes 64 or 62. Alternatively, the electrodes 56 may be formed in such a manner that the portions to be connected to the external electrodes 62 and 64 are exposed as layers in the lamination and the other portions are not exposed, as shown in FIGS. 6 and 7. In such a case, it is not necessary to use insulating films 58 and 60.

In the piezoelectric resonator 50, the external electrodes 62 and 64 are used as input/output electrodes. When the piezoelectric resonator 50 is operated, an electric field is applied to the portion between each adjacent pair of the electrodes 56 defining a central section of the base member 52. The base member 52 is thereby preferably made piezoelectrically active in the central section. However, the base member 52 is preferably not made piezoelectrically active in its opposite end sections because it is not polarized in the opposite end sections and because no electric field is applied in the opposite end sections since no electrodes are disposed on the opposite end surfaces of the base member 52. Thus, the central section of the base member 52 is preferably formed as an active section 66 which is activated by an input signal while the opposite end sections of the base member 52 are preferably formed as inactive sections 68 which are not activated in response to an input signal. Each inactive section 68 is defined as a section in which no driving force is generated in response to an input signal. Accordingly, an electric field may be applied to the portion of the base member 52 between each adjacent pair of electrodes 56 if the portion between the electrodes is not polarized. Also, a structure for inhibiting application of an electric field to each of the corresponding polarized piezoelectric layers 54 may be used. Such inactive section 68 may be provided in any desired location in the base member 52. Also, it is not always necessary to form inactive sections 68; the entire base member 52 may be formed as an active section.

When a signal is input to this piezoelectric resonator 50, a voltage is applied in opposite directions to the piezoelectric layers 54 in the active section 66, in which layers 54 are polarized in opposite directions. All the piezoelectric layers 54 are thereby caused to expand and contract and, as a result, the base member 52 vibrates as a whole integral unit in the longitudinal fundamental mode with a node being defined at substantially the approximate center of the base member 52. In this piezoelectric resonator 50, the direction of polarization of the active section 66, the direction of each electric field according to a signal and the direction of vibration of the active section 66 are the same. That is, the piezoelectric resonator 50 is a stiffened type resonator.

Piezoelectric resonators 50a to 50d constructed as described above are preferably disposed on the supporting substrate 12. The piezoelectric resonator 50a is mounted on the supporting members 22 and 24 with its external electrodes 62 and 64 bonded to the supporting members 22 and 24, respectively, by an electroconductive adhesive 70 or the like. When the external electrodes 62 and 64 are attached to the supporting members 22 and 24, the electroconductive adhesive 70 contacts the surface electrodes 40 of the supporting members 22 and 24 to electrically connect the external electrodes 62 and 64 to the surface electrodes 40. Similarly, the piezoelectric resonator 50b is mounted on the supporting members 26 and 28 with its external electrodes 62 and 64 bonded to the supporting members 26 and 28, respectively, by electroconductive adhesive 70 or the like. Also, the piezoelectric resonator 50c is mounted on the supporting members 30 and 32 with its external electrodes 62 and 64 bonded to the supporting members 30 and 32, respectively, by electroconductive adhesive 70 or the like. Further, the piezoelectric resonator 50d is mounted on the supporting members 34 and 36 with its external electrodes 62 and 64 bonded to the supporting members 34 and 36, respectively, by electroconductive adhesive 70 or the like.

A metallic cap (not shown) is placed on the supporting substrate 12. To prevent the metal cap from being short-circuited to the pattern electrodes 14, 16, 18, and 20, an insulating resin is preferably applied to the supporting substrate 12 and the pattern electrodes 14, 16, 18, and 20 in advance. By capping with the metallic cap, the manufacture of the ladder type filter is completed.

Figure 8:
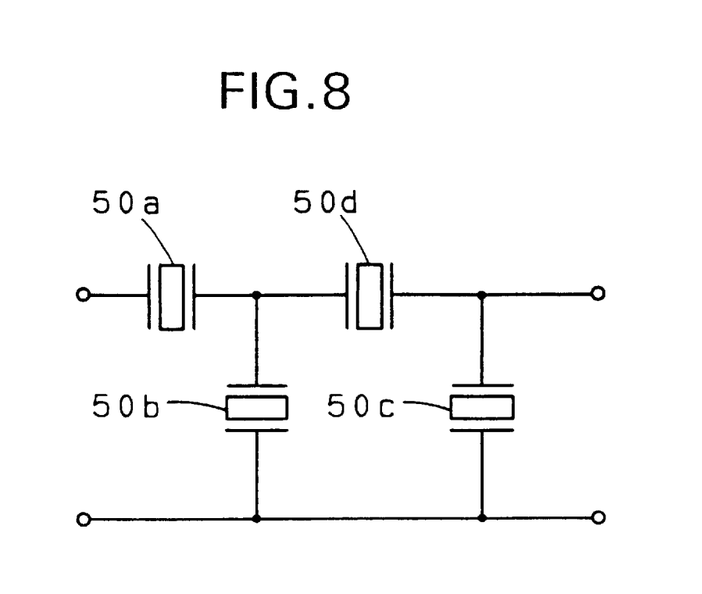
FIG. 8 is an equivalent circuit diagram of the ladder type filter shown in FIG. 1.
Figure 9:
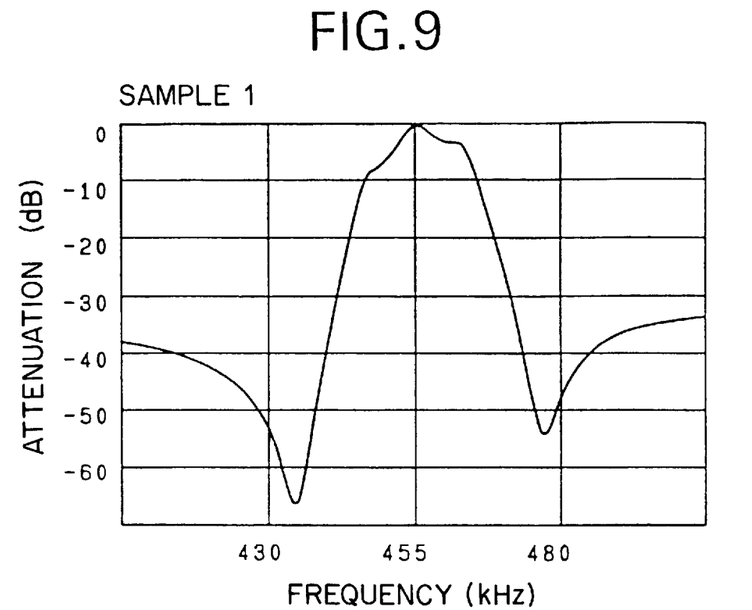
FIG. 9 is a graph showing a filtering characteristic of a sample 1 of the ladder type filter.
Figure 10:
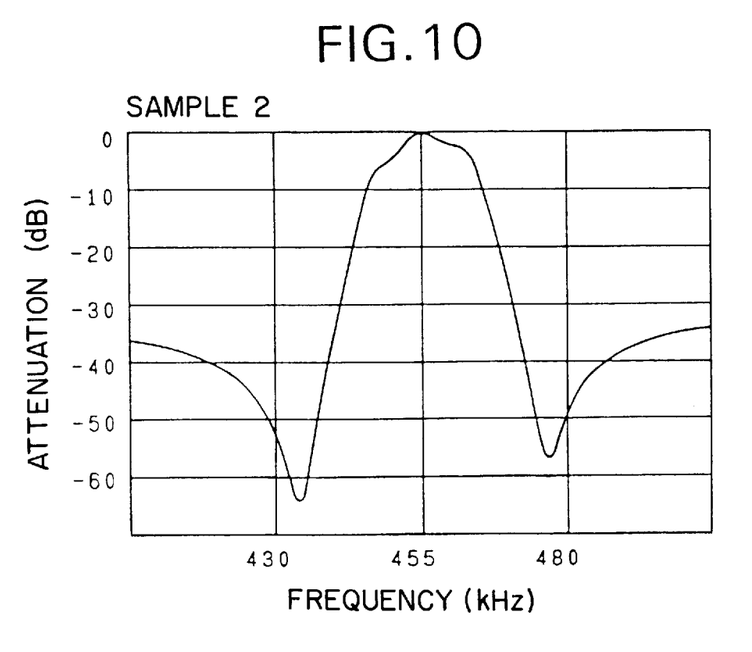
FIG. 10 is a graph showing a filtering characteristic of a sample 2 of the ladder type filter.

This ladder type filter 10 has a circuit in a ladder form such as that shown in FIG. 8. For example, two piezoelectric resonators 50a and 50d preferably serve as series resonators while the other two piezoelectric resonators 50b and 50c preferably serve as parallel resonators. The ladder type filter 10 constructed as described above is designed so that the parallel piezoelectric resonators 50b and 50c have substantially larger capacitances than the series piezoelectric resonators 10a and 10d. In the ladder type filter, an attenuation characteristic is determined by an impedance characteristic of the series piezoelectric resonators 50a and 50d and an impedance characteristic of the parallel piezoelectric resonators 50b and 50c.

Filters having a center frequency of 455 kHz corresponding to the intermediate frequency of radio broadcasting and communication systems were made as samples 1 to 7 in accordance with the above-described ladder type filter 10. Filtering characteristics of samples 1 to 7 varied by changing the width of the piezoelectric resonators 50a to 50d, represented by w, the thickness of the piezoelectric resonators 50a to 50d, represented by t, and the number of laminated layers each comprising of one of the piezoelectric layers 54 and one of the electrodes 56 adjacent to the piezoelectric layer 54, represented by n, were measured. The relationship between the filtering characteristics and the values w, t and n was discovered and then examined. Table 1 shows the results of the measurement and examination, and FIGS. 9 to 15 shows the filtering characteristics of samples 1 to 7 of the ladder type filter.

TABLE 1

| Sample No. | | 1 | 2 | 3 | 4 | 5 | 6 | 7 |
|---|---|---|---|---|---|---|---|---|
| 2 dB Passband Width (kHz) | | 4.7 | 6.9 | 10.1 | 11.9 | 10.8 | 8.9 | 5.8 |
| Series Resonators | Number of Laminated Layers n | 20 | 16 | 10 | 5 | 3 | 2 | 2 |
| | Width w (mm) | 1.0 | 1.0 | 1.0 | 1.2 | 1.1 | 1.6 | 0.8 |

TABLE 1-continued

| Sample No. | | 1 | 2 | 3 | 4 | 5 | 6 | 7 |
|---|---|---|---|---|---|---|---|---|
| | Thickness t (mm) | 1.0 | 0.8 | 1.0 | 1.0 | 1.1 | 0.8 | 0.8 |
| | log10 (n²wt) | 2.6 | 2.3 | 2.0 | 1.5 | 1.0 | 0.71 | 0.6 |
| Parallel Resonators | Number of Laminated Layers n | 44 | 32 | 25 | 20 | 10 | 5 | 5 |
| | Width w (mm) | 2.0 | 1.95 | 1.6 | 0.75 | 1.0 | 2.0 | 1.0 |
| | Thickness t (mm) | 1.0 | 1.0 | 1.0 | 1.0 | 1.0 | 1.0 | 1.0 |
| | log10 (n²wt) | 3.6 | 3.3 | 3.0 | 2.5 | 2.0 | 1.7 | 1.6 |

From these measurement results, it is understood that favorable filtering characteristics can be obtained when w, t and n satisfy an inequality: $1 \leq \log_{10}(n^2wt) \leq 3$. In samples 1 and 2, $\log_{10}(n^2wt)$ of the parallel resonators is out of this range. In samples 6 and 7, $\log_{10}(n^2wt)$ of the series resonators is out of this range. These ladder type filters have distorted filtering characteristics and smaller 2 dB passband widths.

Figure 11:
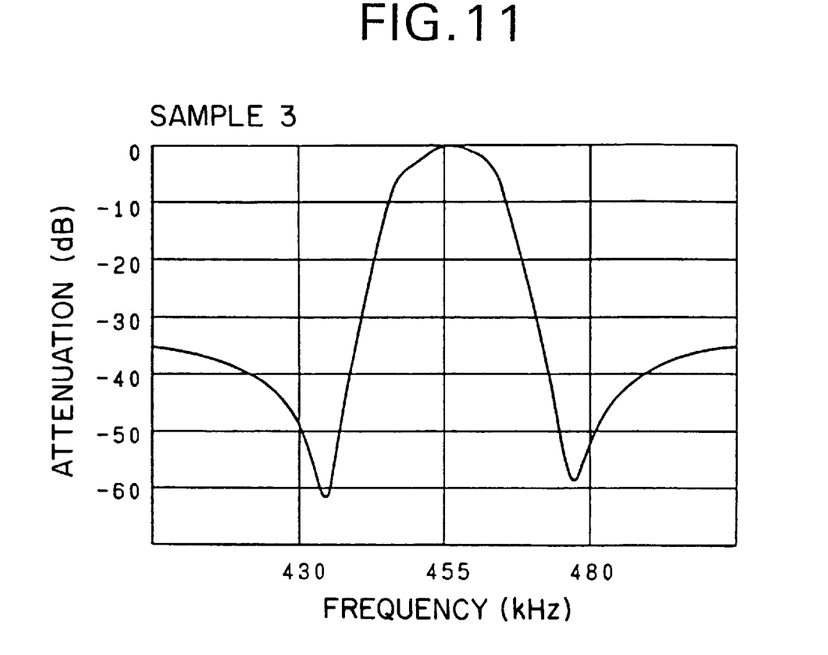
FIG. 11 is a graph showing a filtering characteristic of a sample 3 of the ladder type filter.
Figure 12:
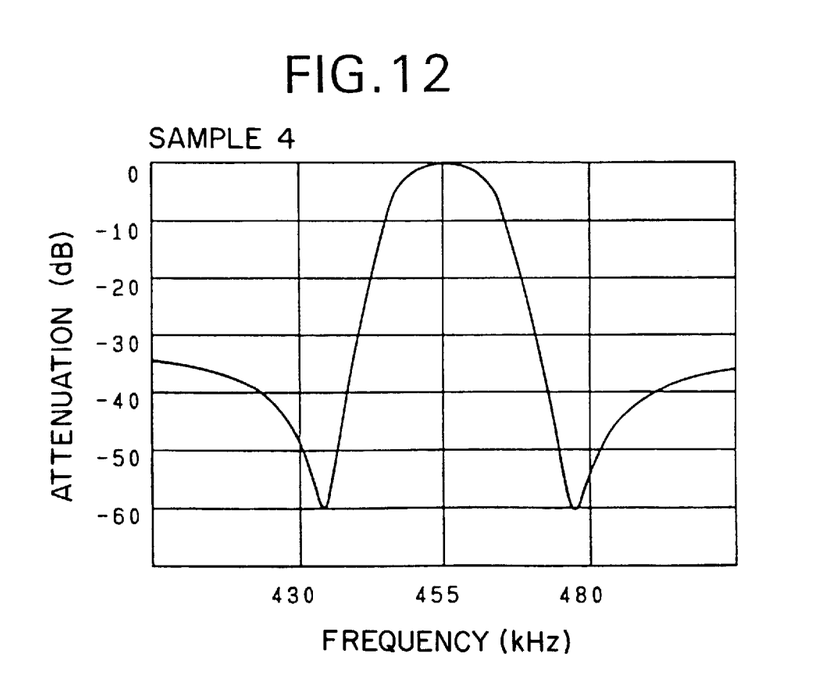
FIG. 12 is a graph showing a filtering characteristic of a sample 4 of the ladder type filter.
Figure 13:
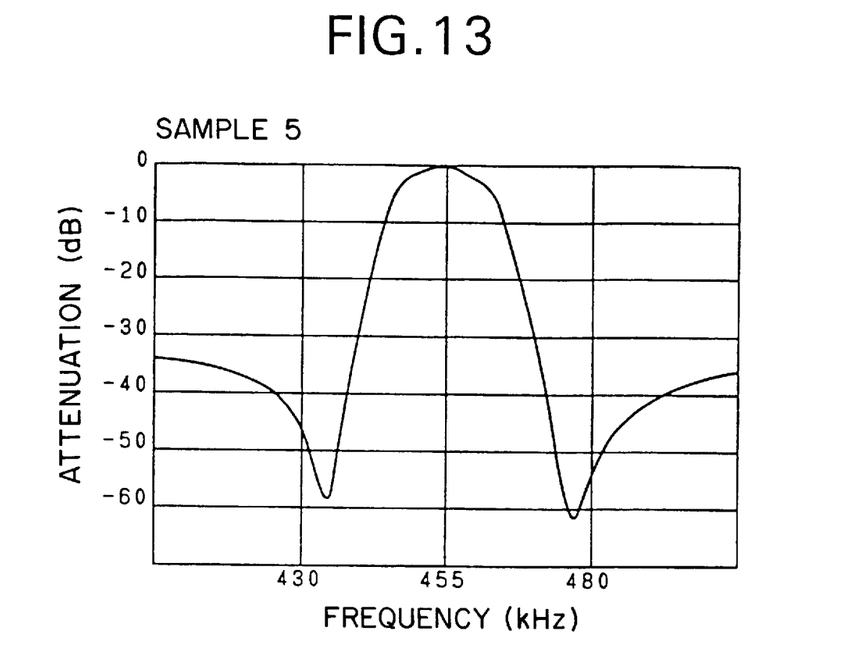
FIG. 13 is a graph showing a filtering characteristic of a sample 5 of the ladder type filter.
Figure 14:
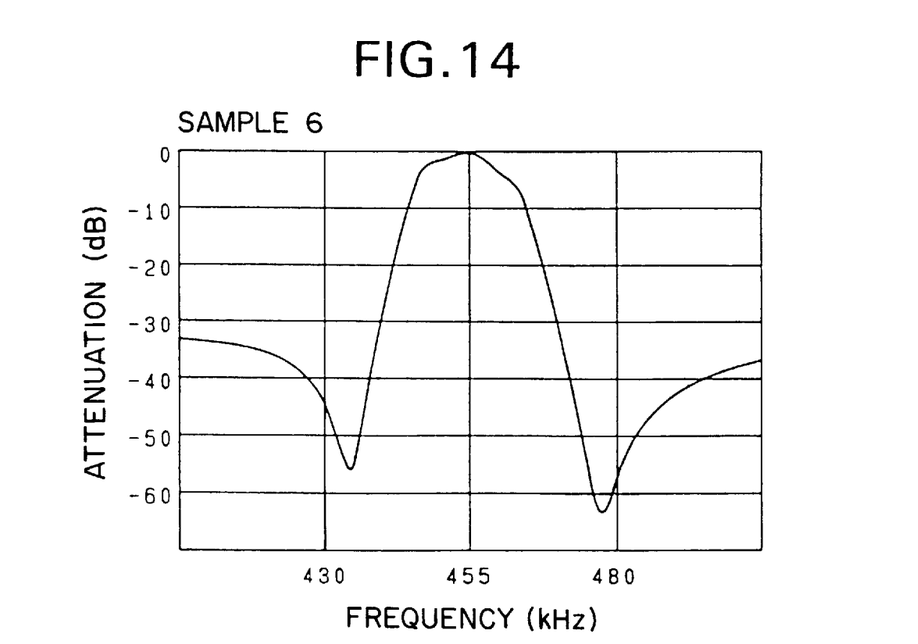
FIG. 14 is a graph showing a filtering characteristic of a sample 6 of the ladder type filter.
Figure 15:
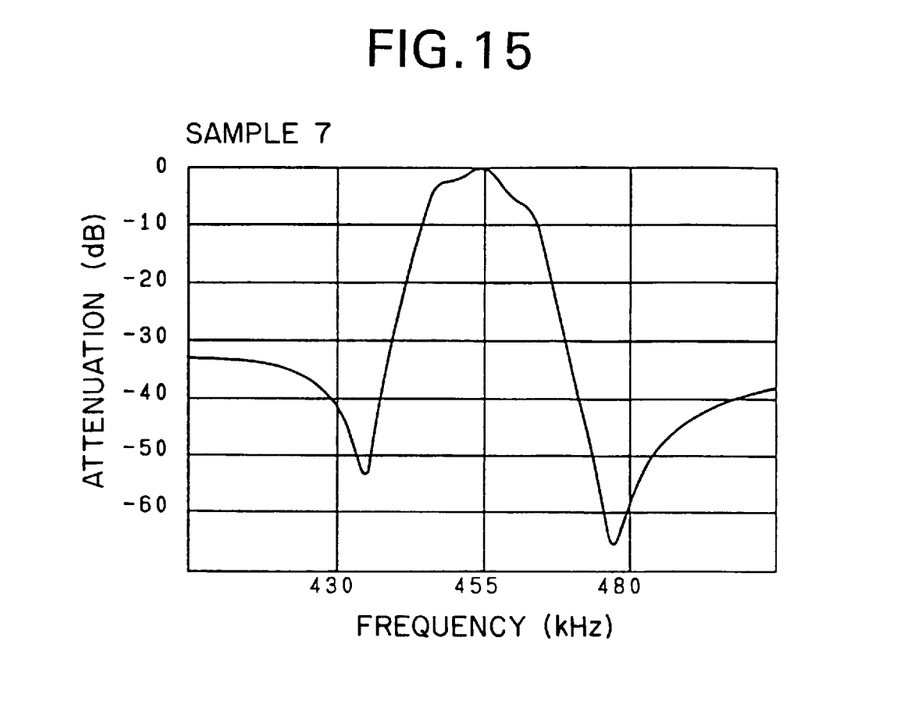
FIG. 15 is a graph showing a filtering characteristic of a sample 7 of the ladder type filter.

In contrast, $\log_{10}(n^2wt)$ of samples 3 to 5 of the ladder type filter is within the range shown above, and these ladder type filters have undistorted filtering characteristics and larger passband widths. In particular, sample 4 of the ladder type filter has an excellent filtering characteristic as well as an excellent 2 dB passband width. In this filter, $\log_{10}(n^2wt)$ of the series resonators is 1.5 while $\log_{10}(n^2wt)$ of the parallel resonators is 2.5.

The width w, the thickness t and the number n of laminated layers of piezoelectric resonators 50 used in ladder type filter 10 are preferably selected so as to satisfy the inequality shown above, thus obtaining a ladder type filter having a substantially improved filtering characteristic. Also, a chip type filter can be constructed by mounting piezoelectric resonators on an insulating substrate having pattern electrodes provided on a surface of the substrate and by covering these parts with a metallic cap. This chip type filter can be designed as an electronic component adapted to be mounted in a surface mount manner on a printed circuit board or the like.

The construction of piezoelectric resonator 50 may alternatively be such that two external electrodes are provided on opposite side surfaces of base member 52 instead of being provided on one side surface. In such a case, one of the external electrodes is placed on and connected to a pattern electrode while the other external electrode is connected to another pattern electrode by a lead wire or the like. However, in the case where two external electrodes are disposed on one side surface, piezoelectric resonators 50a to 50d can be mounted on supporting substrate 12 in a surface mount manner, thereby enabling ladder type filter 10 to be reduced in size. While a four-element ladder type filter using four piezoelectric resonators 50a to 50d has been described, the preferred embodiments of the present invention can, of course, be applied to a ladder type filter having any other number of elements, e.g., a six-element ladder type filter.

While the invention has been particularly shown and described with reference to preferred embodiments thereof, it will be understood by those skilled in the art that the foregoing and other change in form and details may be made therein without departing from the spirit and scope of the invention.

What is claimed is:
1. A ladder type filter comprising:
a plurality of piezoelectric resonators connected in series and in parallel in a ladder arrangement, each of said piezoelectric resonators including a base member having a plurality of piezoelectric layers and a plurality of the internal electrodes alternately laminated along a longitudinal direction of the base member, said piezoelectric resonator being arranged to vibrate in a longitudinal direction of said base member by application of an electric field between each adjacent pair of said electrodes; wherein
if a width of each of said piezoelectric resonators is w, a thickness of each of said piezoelectric resonators is t, and the number of laminated layers each including one of said piezoelectric layers and one of said internal electrodes disposed adjacent to a corresponding one of said piezoelectric layers is n, then an inequality $1 \leq \log_{10}(n^2wt) \leq 3$ is satisfied.

2. A ladder type filter according to claim 1, wherein each of said piezoelectric layers is polarized along the longitudinal direction of said base member.

3. A ladder type filter according to claim 1, wherein adjacent pairs of said piezoelectric layers located on opposite sides of each of said internal electrodes are polarized in opposite directions.

4. A ladder type filter according to claim 1, wherein each adjacent pair of said internal electrodes are respectively connected to two external electrodes which are disposed on one side surface of said base member.

5. A ladder type filter according to claim 1, wherein a plurality of said piezoelectric resonators are connected in series and in parallel in a ladder arrangement on an insulating substrate having pattern electrodes disposed on a surface of said insulating substrate, and
a cap is mounted on said insulating substrate so as to cover said piezoelectric resonators.

6. A ladder type filter according to claim 1, further comprising a substrate and a plurality of support members for supporting said plurality of piezoelectric resonators.

7. A ladder type filter according to claim 6, wherein said substrate has a plurality of pattern electrodes disposed on a surface thereof and said plurality of support members are mounted on said plurality of pattern electrodes to electrically connect said plurality of piezoelectric resonators to said plurality of pattern electrodes.

8. A ladder type filter according to claim 6, wherein said plurality of support members each include an electroconductive adhesive material.

9. A ladder type filter according to claim 6, wherein each of said plurality of piezoelectric resonators has a node point defined at a center thereof and each of said plurality of piezoelectric resonators is supported on said substrate at said center thereof.

10. A ladder type filter according to claim 1, wherein said piezoelectric base member includes an active portion and at least one non-active portion.

11. A ladder type filter comprising:
a plurality of piezoelectric resonators connected in series and in parallel in a ladder arrangement, each of said piezoelectric resonators including a base member having an active portion and at least one non-active portion and including an integral unit containing a plurality of piezoelectric layers and a plurality of internal electrodes, said piezoelectric resonator being arranged to vibrate in a longitudinal direction of said base member; wherein if a width of each of said piezoelectric resonators is w, a thickness of each of said piezoelectric resonators is t, and the number of laminated layers each including one of said piezoelectric layers and one of said internal electrodes disposed adjacent to a corresponding one of said piezoelectric layers is n, then an inequality $1 \leq \log_{10}(n^2 wt) \leq 3$ is satisfied.

12. A ladder type filter according to claim 11, wherein each of said piezoelectric layers is polarized along the longitudinal direction of said base member.

13. A ladder type filter according to claim 11, wherein adjacent pairs of said piezoelectric layers located on opposite sides of each of said internal electrodes are polarized in opposite directions.

14. A ladder type filter according to claim 11, wherein each adjacent pair of said internal electrodes are respectively connected to two external electrodes which are disposed on one side surface of said base member.

15. A ladder type filter according to claim 11, wherein a plurality of said piezoelectric resonators are connected in series and in parallel in a ladder arrangement on an insulating substrate having pattern electrodes disposed on a surface of said insulating substrate, and a cap is mounted on said insulating substrate so as to cover said piezoelectric resonators.

16. A ladder type filter according to claim 11, further comprising a substrate and a plurality of support members for supporting said plurality of piezoelectric resonators.

17. A ladder type filter according to claim 16, wherein said substrate has a plurality of pattern electrodes disposed on a surface thereof and said plurality of support members are mounted on said plurality of pattern electrodes to electrically connect said plurality of piezoelectric resonators to said plurality of pattern electrodes.

18. A ladder type filter according to claim 16, wherein said plurality of support members each include an electroconductive adhesive material.

19. A ladder type filter according to claim 16, wherein each of said plurality of piezoelectric resonators has a node point defined at a center thereof and each of said plurality of piezoelectric resonators is supported on said substrate at said center thereof.

20. A ladder type filter according to claim 11, wherein said plurality of piezoelectric layers and plurality of the internal electrodes of the piezoelectric base member are alternately laminated along a longitudinal direction of the base member to form said integral unit.

* * * * *